US009159721B2

United States Patent
Okawara et al.

(10) Patent No.: US 9,159,721 B2
(45) Date of Patent: Oct. 13, 2015

(54) SEMICONDUCTOR DEVICE COMPRISING AN DIODE REGION AND AN IGBT REGION

(71) Applicant: TOYOTA JIDOSHA KABUSHIKI KAISHA, Toyota-shi, Aichi-ken (JP)

(72) Inventors: Jun Okawara, Nisshin (JP); Yusuke Yamashita, Nagoya (JP); Satoru Machida, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/617,357

(22) Filed: Feb. 9, 2015

(65) Prior Publication Data

US 2015/0249083 A1 Sep. 3, 2015

(30) Foreign Application Priority Data

Mar. 3, 2014 (JP) .................. 2014-040412

(51) Int. Cl.
*H01L 29/00* (2006.01)
*H01L 27/06* (2006.01)
*H01L 29/739* (2006.01)
*H01L 29/47* (2006.01)
*H01L 29/66* (2006.01)
*H01L 29/872* (2006.01)
*H01L 29/06* (2006.01)
*H01L 29/10* (2006.01)

(52) U.S. Cl.
CPC ........ *H01L 27/0635* (2013.01); *H01L 29/0696* (2013.01); *H01L 29/1095* (2013.01); *H01L 29/47* (2013.01); *H01L 29/66348* (2013.01); *H01L 29/66734* (2013.01); *H01L 29/7393* (2013.01); *H01L 29/7395* (2013.01); *H01L 29/7397* (2013.01); *H01L 29/872* (2013.01); *H01L 2924/12032* (2013.01); *H01L 2924/1305* (2013.01); *H01L 2924/13055* (2013.01)

(58) Field of Classification Search
CPC ............. H01L 2924/12032; H01L 2924/1305; H01L 29/0696; H01L 29/1095; H01L 2924/13055; H01L 29/872; H01L 29/66734; H01L 29/7395; H01L 29/7397; H01L 29/66348
See application file for complete search history.

(56) References Cited

U.S. PATENT DOCUMENTS

| 2006/0006458 | A1* | 1/2006 | Motai et al. ................... 257/330 |
| 2006/0197152 | A1* | 9/2006 | Tokano et al. ................ 257/341 |
| 2012/0043581 | A1  | 2/2012 | Koyama et al. |
| 2012/0061721 | A1* | 3/2012 | Kimura et al. ................ 257/133 |
| 2012/0273875 | A1* | 11/2012 | Yedinak et al. ............... 257/330 |

(Continued)

FOREIGN PATENT DOCUMENTS

| JP | 2010-263149 A | 11/2010 |
| JP | 2012-043890 A | 3/2012 |

(Continued)

*Primary Examiner* — Ngan Ngo
(74) *Attorney, Agent, or Firm* — Oliff PLC

(57) ABSTRACT

A technology for inhibiting gate interference in an RC-IGBT employing a diode structure having Schottky connections is provided. A semiconductor device includes a semiconductor substrate including a diode region and an IGBT region. In this semiconductor device, the diode region includes: a p-type anode region connected to an anode electrode by an Ohmic contact; a plurality of n-type pillar regions connected to the anode electrode by Schottky contacts; an n-type barrier region; an n-type diode drift region; and an n-type cathode region. An on-resistance of a first pillar region with respect to the anode electrode is higher than an on-resistance of a second pillar region with respect to the anode electrode. The second pillar region is located at a position close to the IGBT region.

3 Claims, 6 Drawing Sheets

(56) References Cited

U.S. PATENT DOCUMENTS

| | | | |
|---|---|---|---|
| 2012/0273916 A1* | 11/2012 | Yedinak et al. | 257/471 |
| 2013/0181328 A1* | 7/2013 | Cao et al. | 257/618 |
| 2014/0048847 A1 | 2/2014 | Yamashita et al. | |
| 2014/0217465 A1 | 8/2014 | Soeno | |

FOREIGN PATENT DOCUMENTS

| | | |
|---|---|---|
| JP | 2013-048230 A | 3/2013 |
| JP | 5630582 B2 | 11/2014 |
| WO | 2013/030943 A1 | 3/2013 |
| WO | 2015/029116 A1 | 3/2015 |

* cited by examiner

SEMICONDUCTOR DEVICE COMPRISING AN DIODE REGION AND AN IGBT REGION

CROSS-REFERENCE TO A RELATED APPLICATION

This application claims priority to Japanese Patent Application No. 2014-040412 filed on Mar. 3, 2014, the contents of which an hereby incorporated by reference into the present application.

TECHNICAL FIELD

A technology disclosed herein relates to a semiconductor device.

DESCRIPTION OF RELATED ART

Japanese Patent Application Publication, No. 2012-043890A discloses a semiconductor-device (i.e. a so-called. RC-IGBT) in which an IGBT and a diode are formed in a single semiconductor substrate.

Further, Japanese Patent Application Publication No. 2013-048230A discloses a diode provided with an n-pillar region and an n-barrier region in order to inhibit a p-n junction of the diode from being turned on. The n-pillar region is connected to an anode electrode by a Schottky contact. The n-pillar region and the n-barrier region form a current path that bypasses the p-n junction. Since the Schottky connection is turned on before the p-n junction is turned on, the p-n junction is inhibited from being turned on.

BRIEF SUMMARY OF INVENTION

As described in Japanese Patent Application Publication No. 2012-043890A, a phenomenon called 'gate interference' may occur in the RC-IGBT. That is, an application of a predetermined voltage to a gate of the IGBT affects the operation of the diode, with a result that the operation of the diode becomes unstable.

A diode structure having the Schottky connection described in Japanese Patent Application Publication No. 2013-048230A may be employed in the diode portion of the RC-IGBT. In this case, the problem of gate interference occurs as well. Therefore, this specification provides a technology for inhibiting the gate interference in the RC-IGBT employing the diode structure having the Schottky connection.

A semiconductor device disclosed in this description comprises: a semiconductor substrate comprising an diode region and an IGBT region; an anode electrode formed on a front surface of the semiconductor substrate within the diode region; a cathode electrode formed on a rear surface of the semiconductor substrate within the diode region; an emitter electrode formed on the front surface within the IGBT region; a collector electrode formed on the rear surface within the IGBT region; a gate insulating film; and a gate electrode. The diode region comprises: a p-type anode region connected to the anode electrode by an Ohmic contact; a plurality of n-type pillar regions located lateral to the anode region, being in contact with the anode region, and connected to the anode electrode by Schottky contacts; an n-type barrier region located at the rear surface side with respect to the anode region, being in contact with the anode region, and connected to the plurality of the pillar regions; an n-type diode drift region located at the rear surface side with respect to the barrier region, and having an n-type impurity concentration lower than that in the barrier region; and an n-type cathode region located at the rear surface side with respect to the diode drift region, connected to the cathode electrode, and having an n-type impurity concentration higher than that in the diode drift region. The IGBT region comprises: an n-type emitter region connected to the emitter electrode by an Ohmic contact; a p-type body region connected to the emitter electrode by an Ohmic contact; an n-type IGBT drift region connected to the diode drift, region, and separated from the emitter region by the body region; and a p-type collector region connected to the collector electrode, and separated from the body region by the IGBT drift region. The gate electrode is configured to face, via the gate insulating film, the body region separating the emitter region and the IGBT drift region. An on-resistance of a first pillar region among the plurality of the pillar regions with respect to the anode electrode is higher than an on-resistance of a second pillar region among the plurality of the pillar regions with respect to the anode electrode. The second pillar region is located at a position closer to the IGBT region than the first pillar region.

The term "on-resistance" means a degree of ease for electrical current to pass through a Schottky barrier diode formed by the anode electrode and the corresponding pillar region. A high turn-on voltage of the Schottky barrier diode means a high on-resistance. Further, a small current rise angle of the Schottky barrier diode means a high on-resistance. Further, the anode electrode and the emitter electrode may be integrated with or separated from each other. Further, the cathode electrode and the collector electrode may be integrated with or separated from each other.

In this semiconductor device, the first pillar region which is distant from the IGBT region has a higher on-resistance with respect to the anode electrode than the second pillar region which is close to the IGBT region. For this reason, in the vicinity of the second pillar region, it is harder for a p-n junction (i.e. p-n junction formed by the anode region and the barrier region) to be turned on than that in the vicinity of the first pillar region. That is, in the vicinity of the second pillar region, which is close to the IGBT region, it is hard for the p-n junctions to be turned on and therefore hard for electrical current to flow. For this reason, even if the gate interference prevents electrical current from flowing through an area around the second pillar region, which is close to the IGBT region, the effect of gate interference on the current value of the diode region as a whole is small. For this reason, this semiconductor device is insusceptible to the gate interference.

DETAILED DESCRIPTION OF INVENTION

Embodiment 1

Figure 1:
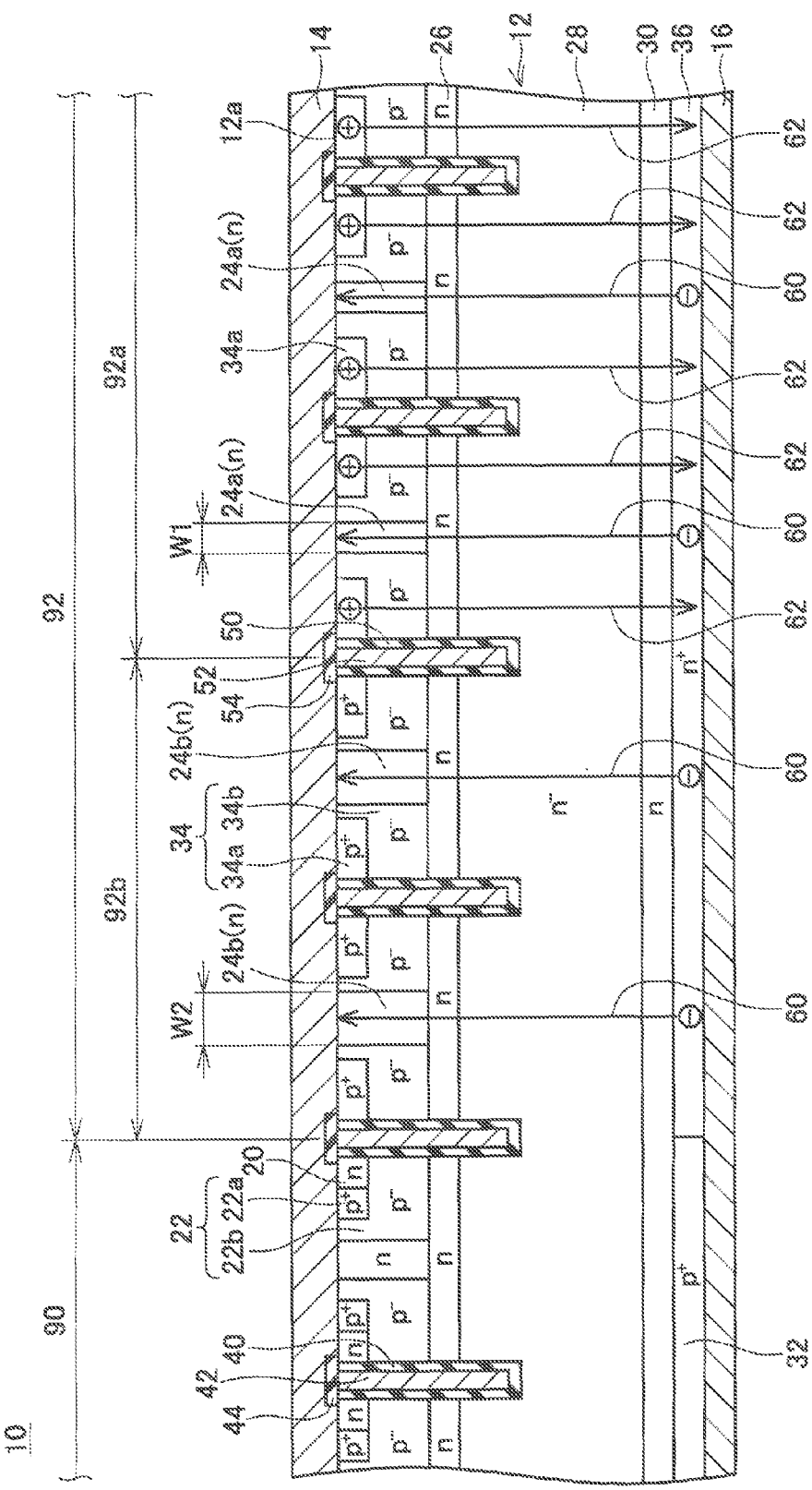
FIG. 1 is a longitudinal sectional view of a semiconductor device 10 of Embodiment 1.
Figure 2:
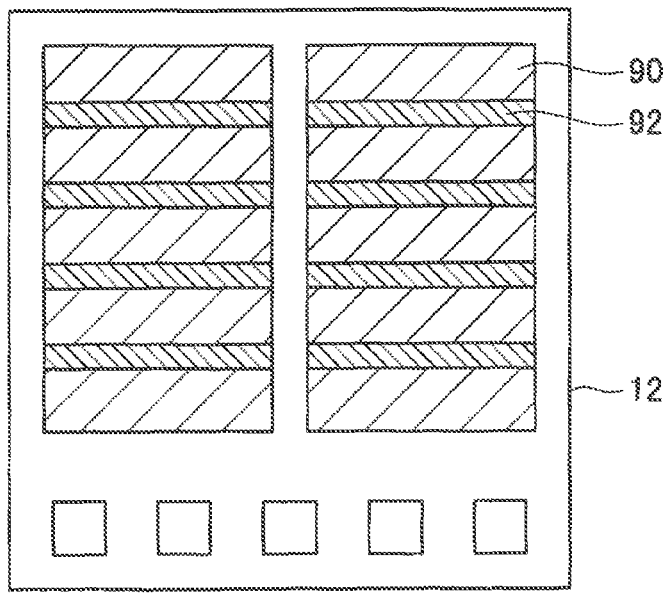
FIG. 2 is a top view of the semiconductor device 10 of Embodiment 1.

A semiconductor device 10 of Embodiment 1 as shown in FIG. 1 includes a semiconductor substrate 12, an upper electrode 14, and a lower electrode 16. The semiconductor substrate 12 is a substrate made of silicon. The upper electrode 14 is formed on an upper surface 12a of the semiconductor substrate 12. The lower electrode 16 is formed on a lower surface of the semiconductor substrate 12. The semiconductor substrate 12 has an IGBT region 90 in which IGBTs are formed and a diode region 92 in which diodes are formed. That is, the semiconductor device 10 is a so-called RC-IGBT. As shown in FIG. 2, the IGBT region 90 and the diode region 92 are alternately formed in the semiconductor substrate 12.

As shown in FIG. 1, in the semiconductor substrate 12 within the diode region 92, anode regions 34, pillar regions 24, a bather region 26, a drift region 28, a buffer region 30, and a cathode region 36 are formed.

The anode regions 34 are of p-type, and are formed in a range exposed at the upper surface 12a of the semiconductor substrate 12. Each of the anode regions 34 has an anode contact region 34a and a low-concentration anode region 34b. The anode contact region 34a is formed in a range exposed at the upper surface 12a of the semiconductor substrate 12. The anode contact region 34a has a high p-type impurity concentration, and is connected to the upper electrode 14 by an Ohmic contact. The low-concentration anode region 34b is formed on a lower side of and lateral to the anode contact region 34a. The low-concentration anode region 34b has a lower p-type impurity concentration than that in the anode contact region 34a.

The pillar regions 24 are of n-type, and are formed in a range exposed at the upper surface 12a of the semiconductor substrate 12. The pillar regions 24 are in contact with the low-concentration anode regions 34b at lateral sides of the low-concentration anode regions 34b. The pillar regions 24 extend from the upper surface 12a of the semiconductor substrate 12 down to a lower end of the anode regions 34. In other words, the pillar regions 24 are n-type regions that are laterally in contact with the anode regions 34 in a zone shallower than the lower ends of the anode regions 34. The pillar regions 24 are connected to the upper electrode 14 by Schottky contacts.

In Embodiment 1, each width W2 of two pillar regions 24b located at positions closer to the IGBT region 90 is greater than each width W1 of pillar regions 24a located at positions more distant from the IGBT region 90 than the pillar regions 24b. For this reason, the area of each pillar region 24b that is exposed at the upper surface 12a is larger than the area of each pillar region 24a that is exposed at the upper surface 12a. In other words, the area of a region where each pillar region 24b is connected to the upper electrode 14 by a Schottky contact is larger than the area of a region where the pillar region 24a is connected to the upper electrode 14 by a Schottky contact. It should be noted that a region of the diode region 92 where the pillar regions 24a are formed (i.e. a region distant from the IGBT region 90) is hereinafter referred to as a "first diode region 92a", and a region of the diode region 92 where the pillar regions 24h are formed (i.e. a region closer to the IGBT region 90) is hereinafter referred to as a "second diode region 92h".

The barrier region 26 is of n-type, and is formed on a lower side of the anode regions 34 and on a lower side of the pillar regions 24. The barrier region 26 is connected to the pillar regions 24. The barrier region 26 is in contact with the anode regions 34.

The drift region 28 is of n-type, and is formed on a lower side of the barrier region 26. The drift region 28 is separated from the anode regions 34 by the barrier region 26. There is a substantially homogeneous distribution of n-type impurity concentrations within the drift region 28. In other words, the drill region 28 is a region Where there is the substantially homogeneous distribution of n-type impurity concentrations, and the barrier region 26 is a region located on an upper side of the drift region 28 and having a higher n-type impurity concentration than the substantially homogeneously-distributed impurity concentration value.

The buffer region 30 is of n-type, and is formed on a lower side of the drift region 28. The buffer region 30 has a higher n-type impurity concentration than that in the drift region 28.

The cathode region 36 is of n-type, and is formed on a lower side of the buffer region 30. The cathode region 36 has a higher n-type impurity concentration than that in the buffer region 30. The cathode region 36 is formed in a range exposed at the lower surface of the semiconductor substrate 12. The cathode region 36 is connected to the lower electrode 16 by an Ohmic contact.

In the upper surface 12a of the semiconductor substrate 12 within the diode region 92, a plurality of trenches is formed. Each of the trenches penetrates the anode region 34 and the barrier region 26 and reaches the drift region 28. An inner surface of each of the trenches is covered with an insulating film 50. A control electrode 52 is formed inside each of the trenches. The control electrode 52 is insulated from the semiconductor substrate 12 by the insulating film 50. The upper surface 12a of each control electrode 52 is covered by an insulating film 54. The control electrode 52 is insulated from the upper electrode 14 by the insulating film 54.

In the semiconductor substrate 12 within the IGBT region 90, emitter regions 20, body regions 22, the pillar regions 24, the barrier region 26, the drift region 28, the buffer region 30, and a collector region 32 are formed.

The emitter regions 20 are of n-type, and are formed in ranges exposed at the upper surface 12a of the semiconductor substrate 12. The emitter regions 20 are connected to the upper electrode 14 by Ohmic contacts.

The body regions 22 are of p-type, and are formed in ranges exposed at the upper surface 12a of the semiconductor substrate 12. Each of the body regions 22 has a body contact region 22a and a low-concentration body region 22b. The body contact region 22a is formed in a range exposed at the upper surface 12a of the semiconductor substrate 12. The body contact region 22a has a high p-type impurity concentration, and is connected to the upper electrode 14 by an Ohmic contact. The low-concentration body region 22b is formed on a lower side of the emitter region 20 and on a lower side of and lateral to the body contact region 22a. The low-concentration body region 22b has a lower p-type impurity concentration than that in the body contact region 22a. The body regions 22 are formed in a range having a substantially same depth as that of the anode regions 34.

The aforementioned pillar regions 24 are formed lateral to the body regions 22.

The aforementioned barrier region 26 is formed on lower sides of the body regions 22.

The aforementioned drift region 28 is formed on the lower side of the barrier region 26 within the IGBT region 90. The drift region 28 extends across the IGBT region 90 and the diode region 92. The drift region 28 is separated from the body regions 22 by the barrier region 26.

The aforementioned buffer region 30 is formed on the lower side of the drift region 28 within the IGBT region 90. The buffer region 30 extends across the IGBT region 90 and the diode region 92.

The collector region 32 is of p-type, and is formed on the lower side of the buffer region 30 within the IGBT region 90. The collector region 32 is formed in a range exposed at the lower surface of the semiconductor substrate 12. The collector region 32 is connected to the lower electrode 16 by an Ohmic contact.

In the upper surface 12a of the semiconductor substrate 12 within the IGBT region 90, a plurality of trenches is formed. Each of the trenches penetrates the emitter region 20, the low-concentration body region 22b, and the barrier region 26 and reaches the drift region 28. An inner surface of each of the trenches is covered with a gate insulating film 40. A gate electrode 42 is formed inside each of the trenches. The gate electrode 42 is insulated from the semiconductor substrate 12 by the gate insulating film 40. The gate electrode 42 faces the emitter region 20, the low-concentration body region 22b, the barrier region 26, and the drift region 28 via the gate insulating film 40. The upper surface 12a of each gate electrode 42 is covered by an insulating film 44. The gate electrode 42 is insulated from the upper electrode 14 by the insulating film 44.

Figure 3:
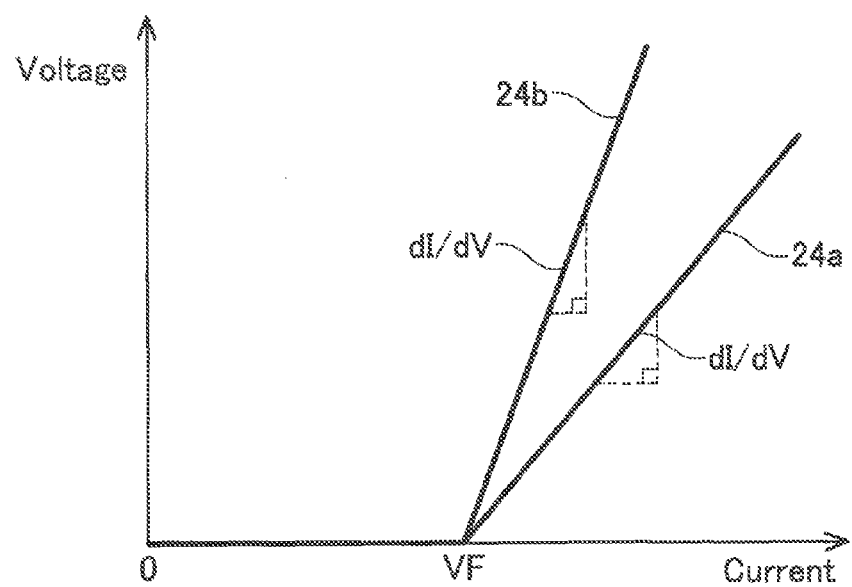
FIG. 3 is a graph showing characteristics of SBDs 24*a* and 24*b* of Embodiment 1.

Next, characteristics of the pillar regions 24a and 24b are described. In the diode region 92, Schottky barrier diodes (hereinafter referred to as "SBDs") are formed by the upper electrode 14 and the pillar regions 24 connected to the upper electrode 14 by Schottky contacts. It should be noted here that as described, above, the area of the Schottky contact region where the pillar regions 24a are connected to the upper electrode 14 by Schottky contacts is smaller than the area of the Schottky contact region where the pillar regions 24b are connected to the upper electrode 14 by Schottky contacts. For this reason, there is a difference in characteristics between SBDs (hereinafter referred to as "SBDs 24a") formed by the upper electrode 14 and the pillar regions 24a and SBDs (hereinafter referred to as "SBDs 24b") formed by the upper electrode 14 and the pillar regions 24b. As shown in FIG. 3, a current rise angle dI/dV of each of the SBDs 24a is smaller than the current rise angle dI/dV of each of the SBDs 24b. On the other hand, the SBDs 24a and the SBDs 24b have substantially the same turn-on voltages VF. As is evident from FIG. 3, it is harder for electrical current to pass through the SBDs 24a than through the SBDs 24b. That is, the SBDs 24a have a higher on-resistance than the SBDs 24b do.

Next, operation of the diode region 92 is described. Suppose a case where a voltage applied to the upper electrode 14 (i.e. a voltage that causes the upper electrode 14 to be positive with respect to the lower electrode 16; hereinafter referred to as "diode forward voltage") is gradually raised. When the diode forward voltage exceeds the turn-on voltages VF of the SBDs 24a and 24b, the SBDs 24a and 24h are turned on. That is, as indicated by arrows 60 in FIG. 1, electrons flow from the lower electrode 16 to the upper electrode 14 via, the cathode region 36, the buffer region 30, the drift region 28, the barrier region 26, and the pillar regions 24. Further, within the diode region 92, p-n junctions are formed by the anode regions 34 and the barrier region 26. A voltage applied to each of the p-n junctions (i.e. a voltage applied between the upper electrode 14 and the barrier region 26) is substantially equal to a voltage applied to the SBD 24 adjacent to the p-n junction. Since the voltage at which the p-n junctions are turned on is higher than the turn-on voltages of the SBDs 24a and 24b, the p-n junctions are not turned on at this stage.

Further increasing the diode forward voltage causes an increase in electrical current flowing through the SBDs 24a and 24b and a rise in voltages applied to the SBDs 24a and 24b. At this occasion, since the SBDs 24a have a high on-resistance, the voltage applied to the SBDs 24a rises more easily than the voltage applied to the SBDs 24b. Therefore, keeping on the increase of the diode forward voltage causes the p-n junctions adjacent to the SBDs 24a (i.e. the pillar regions 24a) to be turned on before the p-n junctions adjacent to the SBDs 24b (i.e. the pillar regions 24b) are turned on. This causes. holes to flow from the upper electrode 14 to the lower electrode 16 via the anode regions 34, the barrier region 26, the drift region 28, the buffer region 30, and the cathode region 36 as indicated by arrows 62 in FIG. 1. Further, electrons flow through paths in an opposite direction indicated by the arrows 62. When the holes flow into the drift region 28 as indicated by the arrows 62, these holes attract the electrons to move from the drift region 28 within the second diode region 92b toward the drift region within the first diode region 92a. This in turn lowers the concentration of electrons in the drift region 28 within the second diode region 92b.

Further increasing the diode forward voltage causes a rise in voltage applied to the SBDs 24b such that the p-n junctions adjacent to the pillar regions 24b are turned on. Thus, in this semiconductor device 10, it is hard for the p-n junctions to to be turned on in the second diode region 92b, which is close to the IGBT region 90 and therefore it is hard for electrical current to flow through the second diode region 92b. That is, the electrical current flowing through the second diode region 92b is smaller than the electrical current flowing through the first diode region 92a.

Next, operation during the gate interference is described. In a state where a gate voltage is being applied to the gate electrodes 42 of the IGBTs, it is hard for the diodes in the vicinity of the IGBT region 90 (i.e. the diodes within the diode region 92b) to be turned on, even if the diode forward voltage is applied. This is because the application of the gate voltage causes channels to be formed within the body region 22 such that a potential of the drift region 28 within the second diode region 92b becomes close to a potential of the upper electrode 14. For details of the gate interference, Japanese Patent Application Publication No. 2012-043890A mentioned above should be referred to. Further, as described in Japanese Patent Application Publication No. 2012-043890A, the occurrence of gate interference causes snapback operation of diodes in the vicinity of an IGBT region.

However, in the semiconductor device 10 of the present embodiment, as described above, electrical current flowing through the second diode region 92b, which is close to the IGBT region 90, is small. For this reason, even if the gate interference prevents electrical current from flowing through the second diode region 92b, a diminution in electrical current flowing through the diode region 92 as a whole is small. For this reason, in the semiconductor device 10 of Embodiment 1, the effect of gate interference on electrical current flowing through the diodes is extremely small.

Further, as described above, in the semiconductor device 10 of Embodiment 1, electrons moves from the second diode region 92b toward the first diode region 92a in a state where the p-n junctions within the first diode region 92a are on and the p-n junctions within the second diode region 92b are not on. For this reason, the concentration of electrons in the drill region 28 within the second diode region 92b is low at a timing when the p-n junctions within the second diode region 92b are turned on. In such a case where the p-n junctions are turned on in a state where the concentration of electrons in the drift region 28 is low, a snapback hardly occurs even if the gate interference has occurred. Therefore, the semiconductor device 10 of Embodiment 1 makes it possible to inhibit the snapback of the diodes during the gate interference.

As described above, in the semiconductor device 10 of Embodiment 1, the effect of gate interference on the characteristics of the diodes can be minimized. In the semiconductor device 10 of Embodiment. 1, the diodes can stably operate.

Embodiment 2

Figure 4:
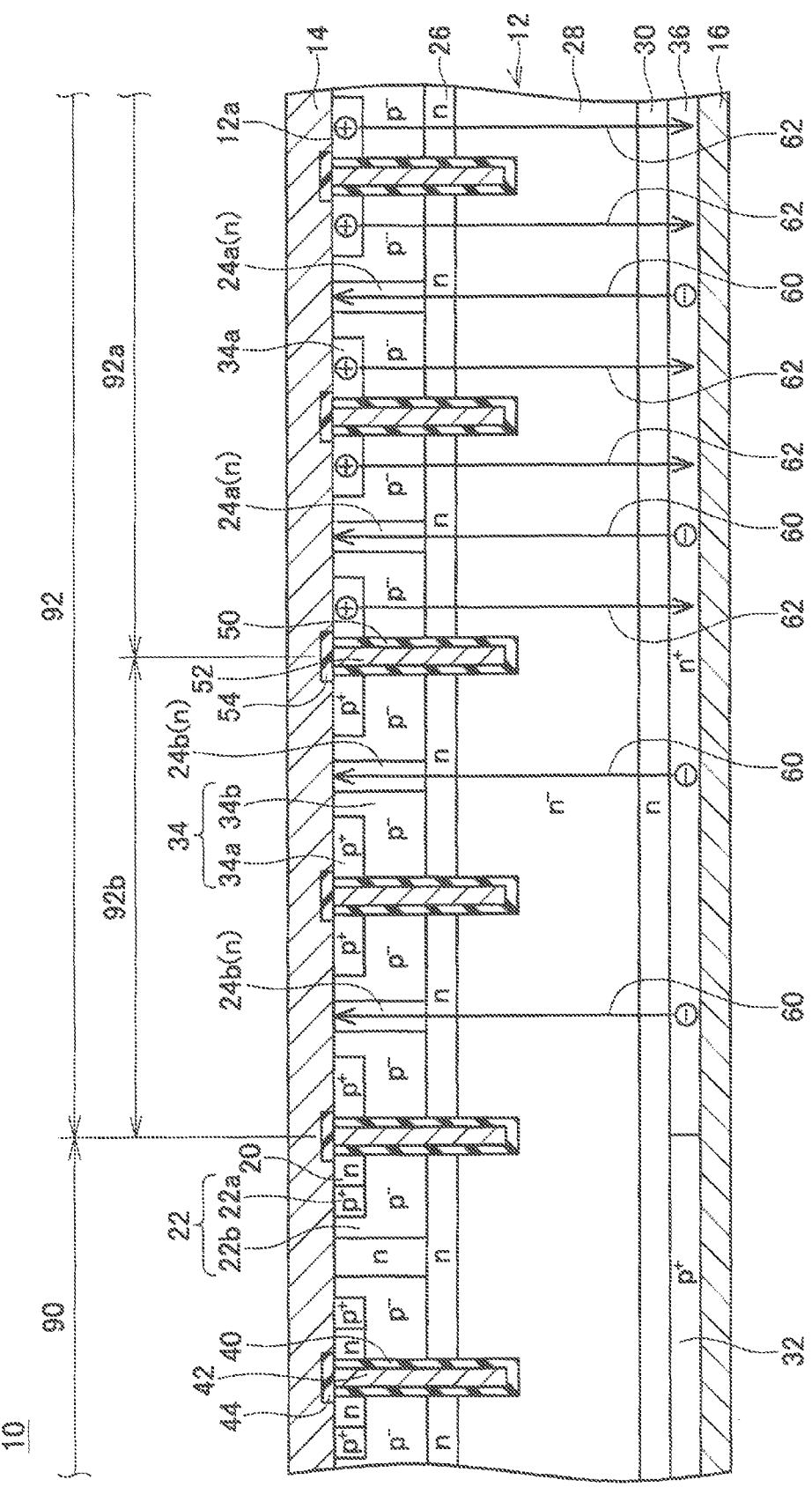
FIG. 4 is a longitudinal sectional view of a semiconductor device of Embodiment 2.

A semiconductor device of Embodiment 2 as shown in FIG. 4 has the same configuration as the semiconductor device 10 of Embodiment 1, except for the configuration of the pillar regions 24. In the semiconductor device of Embodiment 2, the width of each of the pillar regions 24b is equal to the width of each of the pillar regions 24a. That is, the area of the Schottky contact region of the pillar regions 24b is equal to the area of the Schottky contact region of the pillar regions 24a. On the other hand, in the semiconductor device of Embodiment 2, the n-type impurity concentration of each of the pillar regions 24a is lower than the n-type impurity concentration of each of the pillar regions 24b. For this reason, in the semiconductor device of Embodiment 2, the SBDs 24a and 24b have characteristics shown in FIG. 5.

Figure 5:
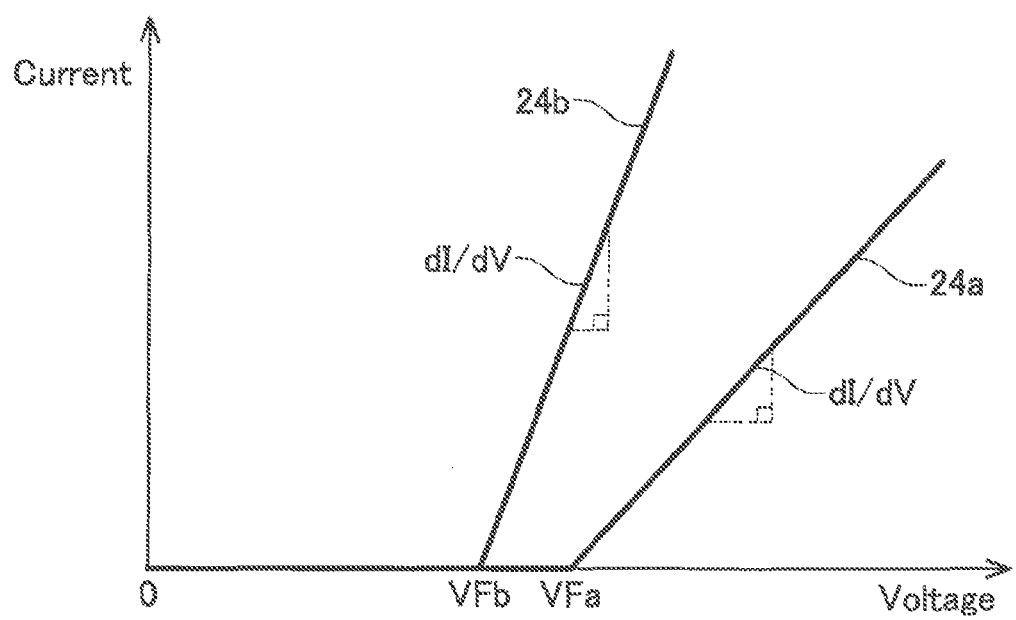
FIG. 5 is a graph showing the characteristics of SBDs 24*a* and 24*b* of Embodiment 2.

As shown in FIG. 5, in the semiconductor device of Embodiment 2, a turn-on voltage VFa of each of the SBDs 24a is higher than a turn-on voltage VFb of each of the SBDs 24b. Furthermore, the current rise angle dI/dV of each of the SBDs 24a is smaller than the current rise angle dI/dV of each of the SBDs 24b. That is, in the semiconductor device of Embodiment 2, similarly to Embodiment 1, the on-resistance of each of the SBDs 24a is higher than the on-resistance of each of the SBDs 24b.

Thus, in the semiconductor device of Embodiment 2 as well, the on-resistance of each of the SBDs 24a, which are distant from the IGBT region 90, is higher than the on-resistance of each of the SBDs 24b, which are close to the IGBT region 90. For this reason, the semiconductor device of Embodiment 2 can operate in a similar manner to the semiconductor device of Embodiment 1. In the semiconductor device of Embodiment 2, similarly to the semiconductor device of Embodiment 1, a diminution in current value due to the gate interference is small, and a snapback of the diodes during the gate interference is hard to occur.

In Embodiment 2 described above, the n-type impurity concentration of each of the pillar regions 24a is lower than the n-type impurity concentration of each of the pillar regions 24h. However, it is only necessary that at least the n-type impurity concentration of each of the pillar regions 24a at the upper surface 12a is lower than the n-type impurity concentration of each of the pillar regions 24b at the upper surface 12a This configuration makes it possible to have the on-resistance of each of the SBDs 24a be higher than the on-resistance of each of the SBDs 24b.

Further, in each of Embodiments 1 and 2 described above, the pillar regions 24 and the barrier region 26 are formed within the TORT region 90. However, the pillar regions 24 and the barrier region 26 do not necessarily need to be formed within the IGBT region 90. Further, in each of Embodiments 1 and 2 described above, the control electrodes 52 are formed within the diode region 92. However, the control electrodes 52 do not necessarily need to be formed within the diode region 92. Further, in each of Embodiments 1 and 2 described above, each of the IGBTs has a trench gate electrode. However each of the IGBTs may have a planar gate electrode.

Figure 6:
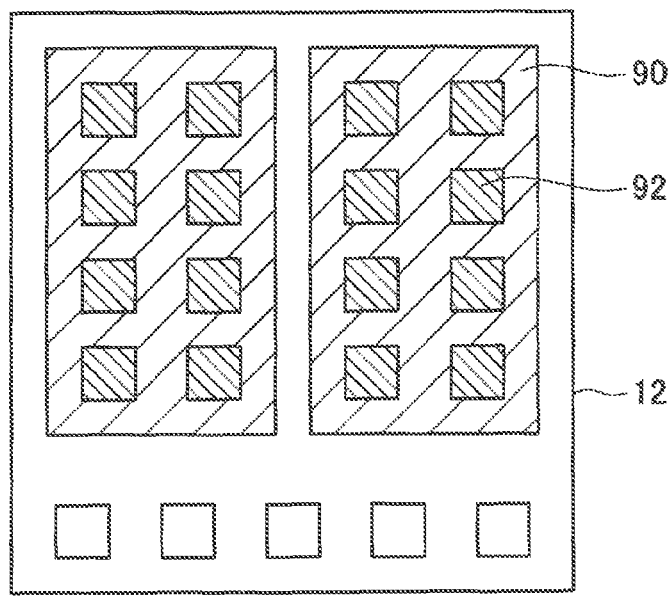
FIG. 6 is a top view of a semiconductor device of a modification.
Figure 7:
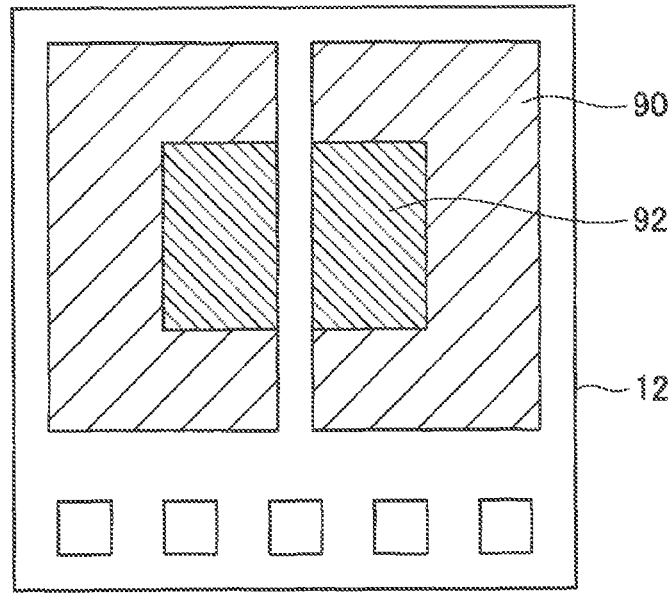
FIG. 7 is a top view of a semiconductor device of a modification.

Further, in each of Embodiments 1 and 2 described above, the IGBT regions 90 and the diode regions 92 are arranged as shown in FIG. 2. However, the arrangement of the IGBT regions 90 and the diode regions 92 may be freely changed. For example, the IGBT regions 90 and the diode regions 92 may be arranged as shown in FIGS. 6 and 7.

Figure 8:
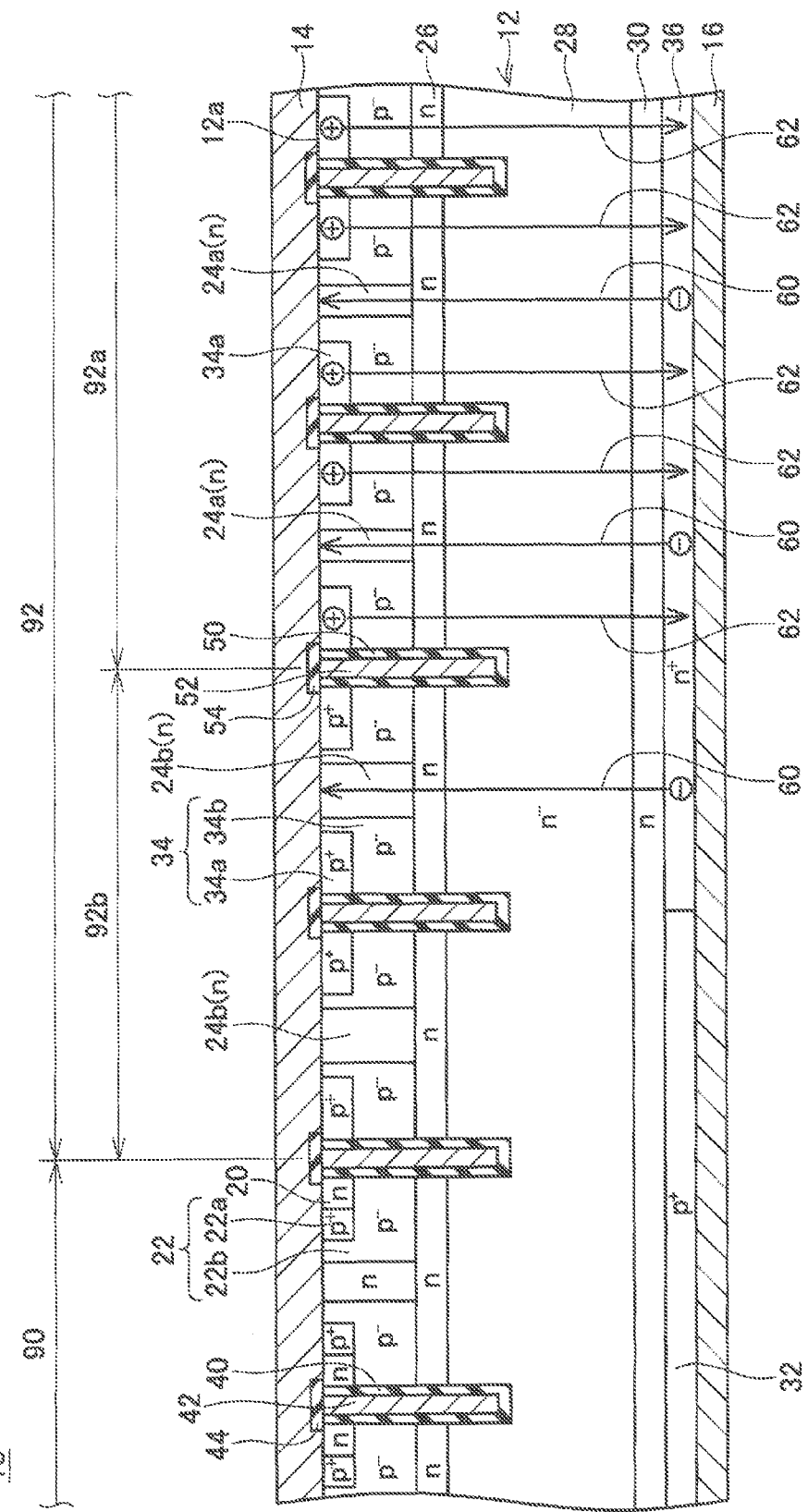
FIG. 8 is a longitudinal section view of a semiconductor device of a modification.

Further, in each of the embodiments described above, a boundary between the IGBT structure and the diode structure on the upper surface side and a boundary between the IGBT structure and the diode structure on the lower surface side match each other. However, these boundaries do not need to match each other. For example, as shown in FIG. 8, the collector region 32 may protrude toward the anode region 34a.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those Objectives gives technical utility to the present invention.

Some of the features of the embodiments to be described are listed below. It should be noted that each of the features listed below is independently useful.

(Feature 1) A contact area between the first pillar region and the anode electrode may be narrower than a contact area between the second pillar region and the anode electrode.

(Feature 2) An n-type impurity concentration at the front surface in the first pillar region may be lower than an n-type impurity concentration at the front surface in the second pillar region.

The invention claimed is:
1. A semiconductor device comprising:
a semiconductor substrate comprising an diode region and an IGBT region;
an anode electrode formed on a front surface of the semiconductor substrate within the diode region;
a cathode electrode formed on a rear surface of the semiconductor substrate within the diode region;
an emitter electrode formed on the front surface within the IGBT region;
a collector electrode formed on the rear surface within the IGBT region;
a gate insulating film; and
a gate electrode,
wherein
the diode region comprises:
a p-type anode region connected to the anode electrode by an Ohmic contact;
a plurality of n-type pillar regions located lateral to the anode region, being in contact with the anode region, and connected to the anode electrode by Schottky contacts;
an n-type barrier region located at the rear surface side with respect to the anode region, being in contact with the anode region, and connected to the plurality of the pillar regions;

an n-type diode drift region located at the rear surface side with respect to the barrier region, and having an n-type impurity concentration lower than that in the barrier region; and an n-type cathode region located at the rear surface side with respect to the diode drift region, connected to the cathode electrode, and having an n-type impurity concentration higher than that in the diode drift region, the IGBT region comprises:

an n-type emitter region connected to the emitter electrode by an Ohmic contact;

a p-type body region connected to the emitter electrode by an Ohmic contact;

an n-type IGBT drift region connected to the diode drift region, and separated from the emitter region by the body region; and a p-type collector region connected to the collector electrode, and separated from the body region by the IGBT drift region, the gate electrode is configured to face, via the gate insulating film, the body region separating the emitter region and the IGBT drift region, an on-resistance of a first pillar region among the plurality of the pillar regions with respect to the anode electrode is higher than an on-resistance of a second pillar region among the plurality of the pillar regions with respect to the anode electrode, and the second pillar region is located at a position closer to the IGBT region than the first pillar region.

2. A semiconductor device of claim 1, wherein a contact area between the first pillar region and the anode electrode is narrower than a contact area between the second pillar region and the anode electrode.

3. A semiconductor device of claim 1, wherein an n-type impurity concentration at the front surface in the first pillar region is lower than an n-type impurity concentration at the front surface in the second pillar region.

* * * * *